(12) United States Patent
Hayamizu

(10) Patent No.: US 8,686,620 B2
(45) Date of Patent: Apr. 1, 2014

(54) ELECTRIC APPARATUS PROVIDED WITH POWER GENERATING FUNCTION

(75) Inventor: Kohei Hayamizu, Tokyo (JP)

(73) Assignee: Soundpower Corporation, Kanagawa (JP)

( * ) Notice: Subject to any disclaimer, the term of this patent is extended or adjusted under 35 U.S.C. 154(b) by 132 days.

(21) Appl. No.: 13/468,948

(22) Filed: May 10, 2012

(65) Prior Publication Data

US 2012/0248937 A1 Oct. 4, 2012

Related U.S. Application Data

(63) Continuation-in-part of application No. PCT/JP2009/006027, filed on Nov. 11, 2009.

(51) Int. Cl.
*H02N 2/00* (2006.01)

(52) U.S. Cl.
USPC ........................................... 310/339; 310/338

(58) Field of Classification Search
USPC ............. 310/338, 339, 311, 316.01, 330–332
IPC ........................................................ H02N 2/00
See application file for complete search history.

(56) References Cited

U.S. PATENT DOCUMENTS

| 8,400,046 | B2 * | 3/2013 | Hayamizu | 310/339 |
| 2002/0190610 | A1 * | 12/2002 | Andre et al. | 310/339 |
| 2006/0238069 | A1 * | 10/2006 | Maruyama et al. | 310/316.01 |
| 2011/0109201 | A1 * | 5/2011 | Ozawa et al. | 310/339 |

FOREIGN PATENT DOCUMENTS

| EP | 1450478 A2 | 8/2004 |
| GB | 2241376 A | 8/1991 |
| JP | S60-102776 A | 6/1985 |
| JP | 07-049388 | 2/1995 |
| JP | 11-303726 | 11/1999 |
| JP | 2004-201376 | 7/2004 |
| JP | 2007-097278 | 4/2007 |
| JP | 2007-143353 | 6/2007 |
| JP | 2008-140206 | 6/2008 |
| JP | 2009-225622 | 10/2009 |

OTHER PUBLICATIONS

PCT Int. App. No. PCT/JP2009/006027; International Preliminary Report on Patentability (English Translation); dated Feb. 9, 2010 (7 pgs.).
PCT Int. App. No. PCT/JP2009/006027; International Search Report (English Translation); dated Feb. 9, 2010 (2 pgs.).

* cited by examiner

*Primary Examiner* — Thomas Dougherty
*Assistant Examiner* — Karen B Addison
(74) *Attorney, Agent, or Firm* — Shay Glenn LLP

(57) ABSTRACT

A remote controller (1) provided with a power generating function is provided with: a main body (10); an operation board (11); operation buttons (12) provided on the operation board (11) so as to be exposed to the outside of the remote controller (1); and a power generating section (14) which has a piezoelectric element that generates an electromotive force when the piezoelectric element is deformed. The operation board (11) can rotate with respect to the main body (10) when an operation force is applied to the operation buttons (12), and the power generating element of the power generating section (14) generates the electromotive force when the power generating element is deformed due to the force applied from the operation board (11) which has been rotated by means of the operation force.

14 Claims, 10 Drawing Sheets

ELECTRIC APPARATUS PROVIDED WITH POWER GENERATING FUNCTION

CROSS REFERENCE TO RELATED APPLICATION

This application is a continuation-in-part of International Application No. PCT/JP2009/006027, filed Nov. 11, 2009, entitled "Electric Apparatus Provided With Power Generating Function," now Publication No. WO 2011/058602 A1. This application is herein incorporated by reference in its entirety.

INCORPORATION BY REFERENCE

All publications and patent applications mentioned in this specification are herein incorporated by reference to the same extent as if each individual publication or patent application was specifically and individually indicated to be incorporated by reference.

FIELD

The present invention relates to an electric apparatus provided with power generating function that generates an electromotive force when deformed.

BACKGROUND

Conventionally known power generation structures using a piezoelectric device includes, for example, a structure in which an electromotive force is generated by directly applying an external force to a piezoelectric device to deform it (e.g., see Patent Document 1) and a structure in which an electromotive force is generated by indirectly applying a force, such as wind or the like, to a piezoelectric device to deform it (e.g., see Patent Document 2).

Furthermore, as an electric apparatus to which a power generation structure using such a piezoelectric device is applied, a mobile phone including a secondary battery that can be recharged by the output of the piezoelectric device has been proposed (e.g., see Patent Document 3). This mobile phone obtains an electromotive force from the piezoelectric device deformed by a force applied when a user pushes an input key.

PRIOR ART DOCUMENT

Patent Document
Patent Document 1 JP-A-7-49388
Patent Document 2 JP-A-11-303726
Patent Document 3 JP-A-2009-225622

SUMMARY OF THE DISCLOSURE

Problems to be Solved by the Invention

However, the power generation structure as described in Patent Documents 1 and 2 is a structure in which power is generated by only one piezoelectric device. Since the amount of power generated by one piezoelectric device is small, it is not realistic that the electric apparatus is driven by this power.

In the power generation structure as described in Patent Document 3, the piezoelectric device is deformed by the force applied when the user pushes the input key. However, the force for pushing the input key may not be able to sufficiently deform the piezoelectric device. The insufficient deformation amount results in power generation insufficient to drive the electric apparatus.

In view of the above, it is an object of the present invention to provide an electric apparatus provided with power generating function that can be sufficiently driven by an electromotive force obtained from a power generation device, such as a piezoelectric device.

Means for Solving the Problems

In order to solve the above problems, one aspect of the invention provides an electric apparatus provided with power generating function, which includes: a main body; an operation panel provided on one side surface of the main body; an operation means provided on the operation panel, to be exposed to the outside of the electric apparatus; and a power generator having a power generation device that generates an electromotive force when deformed, wherein the operation panel can be rotated with respect to the main body by an operation force applied to the operation means, and wherein the power generation device of the power generator generates an electromotive force when deformed by a force from the operation panel rotated by the operation force.

DETAILED DESCRIPTION

Mode for Carrying Out the Invention

Figure 1:
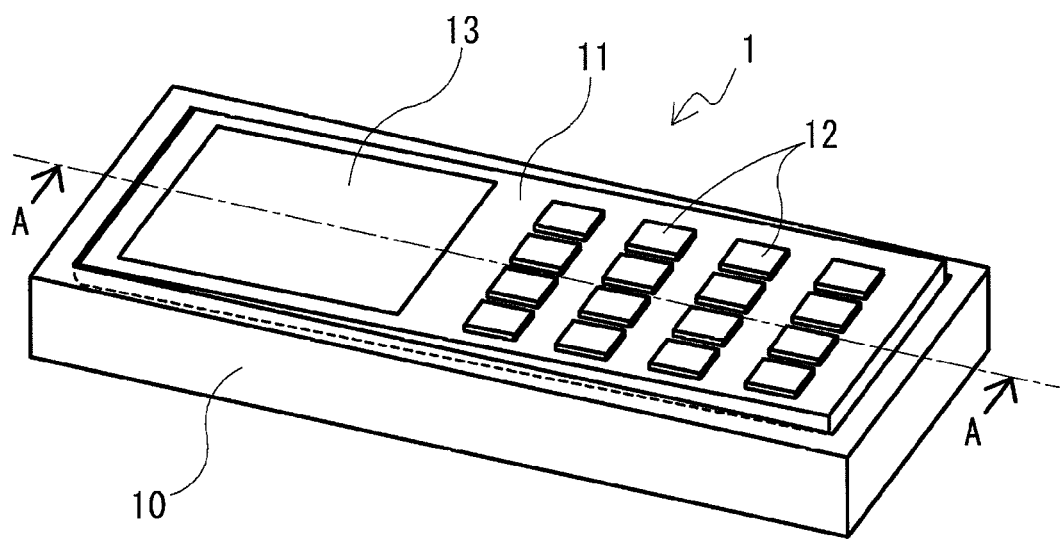
FIG. 1 is a general perspective view of a remote controller in accordance with a first embodiment of the invention.

Embodiments of an electric apparatus provided with power generating function in accordance with the invention are described below in detail with reference to the accompanying drawings. First, I. Basic concept common to the embodiments is described. Then, II. Specific descriptions of the embodiments are given in sequence. Finally, III. Variations of the embodiments are described. However, the invention is not intended to be limited by the embodiments.

I. Basic Concept Common to the Embodiments

First, a basic concept common to the embodiments is described. An electric apparatus provided with power generating function in accordance with the embodiments is an electric apparatus including a power generator that generates an electromotive force when deformed.

A basic configuration and purpose of the electric apparatus in accordance with the embodiments is not limited to any specific one unless otherwise stated. Hereinafter, as an example of the electric apparatus in accordance with the invention, a remote controller for remotely controlling various electric appliances, such as a television set or air-conditioning apparatus, is described.

The power generator includes a power generation device that generates an electromotive force when deformed. For this power generation device, any material may be used that can generate power in response to an external force, including a force that causes distortion, bending or compression. For example, a piezoelectric device, an ionic polymer-metal composite (IPMC) made by plating both sides of an ionic conducting polymer film (gel) with a metal (such as gold), an ionic conducting polymergel film (ICPF) or an artificial muscle made using IPMC or ICPF may be used. Furthermore, these different types of power generation devices may be combined. Hereinafter, the piezoelectric device used for the power generation device is described.

In order to obtain a sufficient electromotive force from the piezoelectric device, the embodiments intend to enable rotation of an operation panel to apply a force to the piezoelectric device and enable layering of the piezoelectric device. Enabling rotation of the operation panel is to provide the operation panel on one side surface of a main body and provide an operation means on the operation panel so that the operation panel can be rotated with respect to the main body by an operation force applied to the operation means. This allows the piezoelectric device to be deformed with a larger force by applying what is called the principle of leverage in comparison with the case of not rotating the operation panel, enabling a larger electromotive force to be generated. On the other hand, enabling layering of the piezoelectric device is to layer a plurality of piezoelectric devices generally in parallel. Deforming the plurality of piezoelectric devices in one operation applied to the operation means enables generation of a larger electromotive force in comparison with the case of providing only one piezoelectric device. Hereinafter, the plurality of piezoelectric devices (power generation devices) layered in this way is referred to as a piezoelectric unit (power generation device module).

II. Specific Descriptions of the Embodiments

The embodiments in accordance with the invention are specifically described below with reference to the accompanying drawings.

First Embodiment

At the beginning, a first embodiment is described. In this embodiment, the electric apparatus is a remote controller; a single operation panel is rotatably provided; and a plurality of power generation device modules each include power generation devices the number of layers of which increases gradually from a position near a rotating shaft of the operation panel to a position far from the rotating shaft.

Basic Configuration

Figure 2:
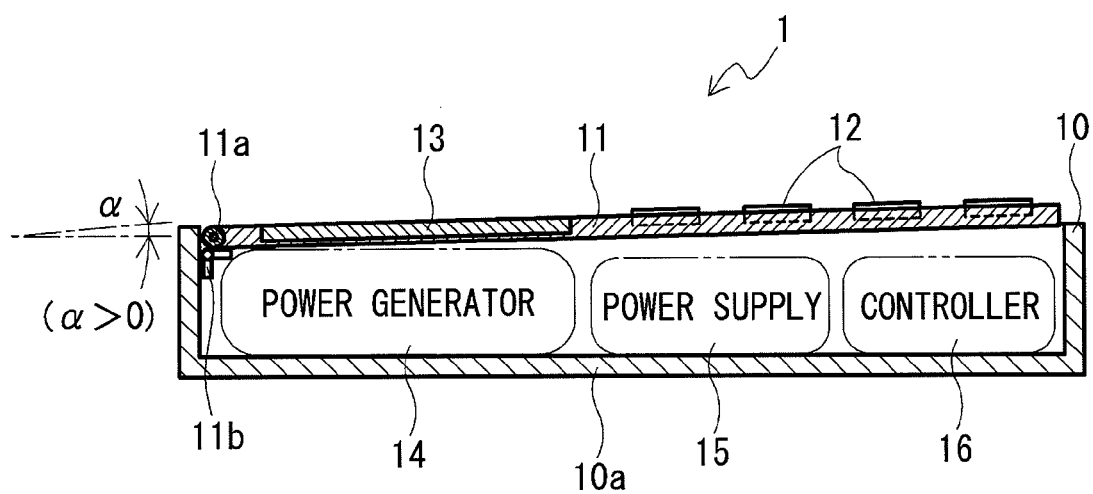
FIG. 2 is a cross-sectional view taken in the direction indicated by the arrows A-A in FIG. 1.

First, a basic configuration of the remote controller in accordance with the first embodiment is described. FIG. 1 is a general perspective view of the remote controller in accordance with the first embodiment. FIG. 2 is a cross-sectional view taken in the direction indicated by the arrows A-A in FIG. 1. As shown in FIG. 1, a remote controller 1 includes an operation panel 11 provided on one side surface of a rectangular-parallelepiped main body 10.

The operation panel 11, formed in a flat panel shape as a whole, includes a plurality of operation buttons 12 and a display 13 provided on its outer surface (the side surface exposed to the outside of the main body 10; the same shall apply hereinafter). The plurality of operation buttons 12 are an operation means for performing various operations on the remote controller 1. The buttons 12 have preassigned functions different from each other. It should be noted that the operation panel 11, the plurality of operation buttons 12 and the display 13 may have any appropriate specific structure. For example, a plurality of push button-type operation buttons 12 may be placed on the top surface of the operation panel 11. However, hereinafter, the remote controller 1 having an operation panel 11 formed of a metal or resin plate-like body is described, the operation panel 11 including on its outer surface a plurality of plate-like operation buttons 12 in the form of a membrane switch, touch sensor, touch panel or the like and a display 13 in the form of a liquid crystal panel.

As shown in FIG. 2, the main body 10 includes a power generator 14, a power supply 15 and a controller 16. The power generator 14 is a power generation means for leveraging an operation force for the remote controller 1 to generate power. The power supply 15 is a power supply means for rectifying and storing an electromotive force generated by the power generator 14 so that the electromotive force can be used to supply power to the remote controller 1. The controller 16 performs various controls for implementing various functions of the remote controller 1.

Figure 3:
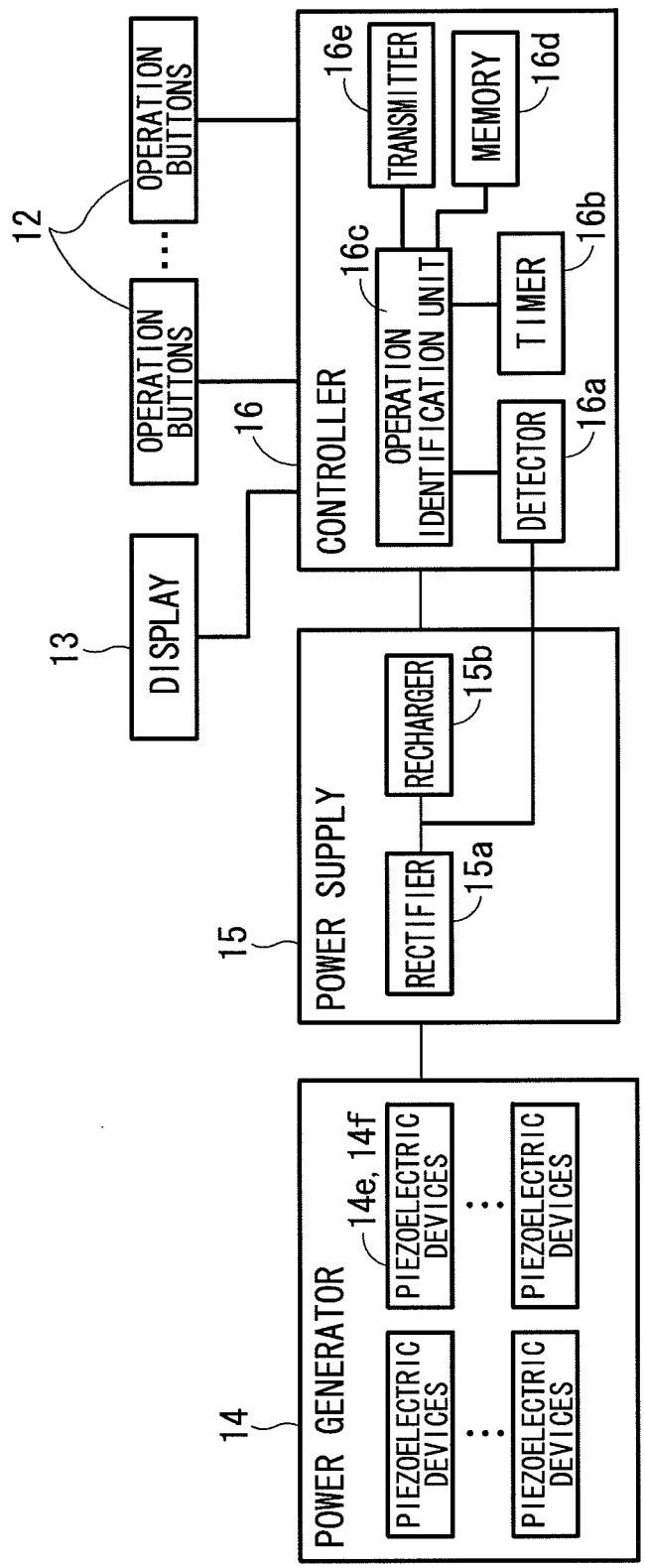
FIG. 3 is a block diagram showing an electric configuration of a remote controller 1 in a functionally conceptual manner.

FIG. 3 is a block diagram showing the electric configuration of the remote controller 1 in a functionally conceptual manner. As shown in FIG. 3, the power generator 14, the power supply 15 and the controller 16 are electrically connected. Also, the plurality of operation buttons 12 and the display 13 are electrically connected to the controller 16.

The power generator 14 includes a plurality of piezoelectric devices (power generation devices) 14e, 14f (described later) that generates an electromotive force when deformed. The specific structure of the piezoelectric devices 14e, 14f is described later.

The power supply 15 includes a rectifier 15a and a recharger 15b. The rectifier 15a, including a bridge rectifier circuit (not shown), rectifies power from the power generator 14. The recharger 15b, including a capacitor or secondary battery (not shown), is charged with power rectified by the rectifier 15a and supplies the power to the controller 16 when the charged power exceeds a predetermined amount.

The controller 16 includes a detector 16a, a timer 16b, an operation identification unit 16c, a memory 16d and a transmitter 16e. The detector 16a is an operation detection means for detecting when any of the operation buttons 12 is operated, by detecting current output from the rectifier 15a to detect when any of the piezoelectric devices 14e, 14f is pressed. The timer 16b is a time measurement means for measuring time under the control of the operation identification unit 16c. The operation identification unit 16c is an operation identification means for identifying what operation has been performed on the operation buttons 12, based on which of the operation buttons 12 has been pushed by a user and the time that has been measured by the timer 16b. The memory 16d is a storage means for storing in nonvolatile manner information necessary for controlling the controller 16. Specifically, the memory 16d previously stores an operation identification table for identifying an operation based on the operation type having been specified by the user and the operation button 12 having been pushed by the user. The transmitter 16e is a signal output means for wirelessly transmitting an operation signal corresponding to the result of identification by the operation identification unit 16c, using any appropriate transmission scheme. Practically, in addition to the components described above, the remote controller 1 may include various parts and the like as implemented in known remote controllers, however the description of those parts and the like is omitted.

Rotatable Structure of Operation Panel

Next, a rotatable structure of the operation panel 11 is described. As shown in FIG. 2, the operation panel 11 is mounted on the main body 10 such that the operation panel 11 can be rotated with respect to the main body 10 by an operation force applied to any of the operation buttons 12. Specifically, the operation panel 11 can be rotated with respect to the main body 10 about a rotating shaft 11a provided along at least one side (a side to the left of FIG. 2 in this embodiment) of the sides of the operation panel 11. The rotating shaft 11a is secured to the operation panel 11 penetrating through the inside of one side of the operation panel 11. Both ends in the axis direction of the rotating shaft 11a are rotatably fitted into shaft holes provided at positions in the main body 10 corresponding to the ends, allowing the operation panel 11 to be rotated about the rotating shaft 11a.

Furthermore, as shown in FIG. 2, a spring 11b is secured to a corner formed by the side of the operation panel 11 along which the rotating shaft 11a is provided and the main body 10. The spring 11b is secured to both the operation panel 11 and the main body 10, holding the operation panel 11 at a predetermined angle with respect to the main body 10.

As shown in FIG. 2, when no operation force is applied to any of the operation buttons 12 (hereinafter referred to as "in non-operated state"), the operation panel 11 is placed at an angle of α (>0) with respect to another side surface of the main body 10 opposite to the operation panel 11 (hereinafter; a bottom surface 10a in the first embodiment and a second embodiment described later) at which the operation panel 11 is not in approximately parallel with the bottom surface 10a (hereinafter referred to as "in non-rotating state").

On the other hand, when an operation force is applied to any of the operation buttons 12 (hereinafter referred to as "in operated state"), the operation force causes the operation panel 11 to be pressed down and rotated downwardly about the rotating shaft 11a against the biasing force of the spring 11b, to an angle of α (≈0) at which the operation panel 11 is in approximately parallel with the bottom surface 10a (hereinafter referred to as "in rotating state"). The angle α is determined by adjusting the number of layers of the piezoelectric devices 14e, 14f described later of a piezoelectric unit 14a described later (or the number of layers of pair-modules 14b) such that the piezoelectric devices 14e, 14f are pressed to be deformed, generating resistance force and then can hardly rotate for more at an angle of α (≈0).

Then, when the operation force having been applied to the operation button 12 is released, the biasing force of the spring 11b presses up the operation panel 11 so as to upwardly rotate the operation panel 11 about the rotating shaft 11a to the original position shown in FIG. 2.

According to this structure, since the user presses down any of the operation buttons 12 provided on the operation panel 11 to rotate the operation panel 11, the power generator 14 can be pressed with a large force due to the principle of leverage, particularly at a position near the rotating shaft 11a. Furthermore, since the power generator 14 is placed at a position near the rotating shaft 11a and the operation buttons 12 are placed at a position near a side of the sides of the operation panel 11 opposite to the rotating shaft 11a, pressing down of any of the operation buttons 12 is performed at a position far from the rotating shaft 11a, which can provide a large rotation moment about the rotating shaft 11a. So, a small force pressing down any of the operation buttons 12 can provide a large pressing force to be applied to the power generator 14, deforming the piezoelectric devices 14e, 14f of the power generator 14 with a larger force, which can provide a large electromotive force.

Layer Structure of Piezoelectric Devices in Power Generator 14

Figure 4:
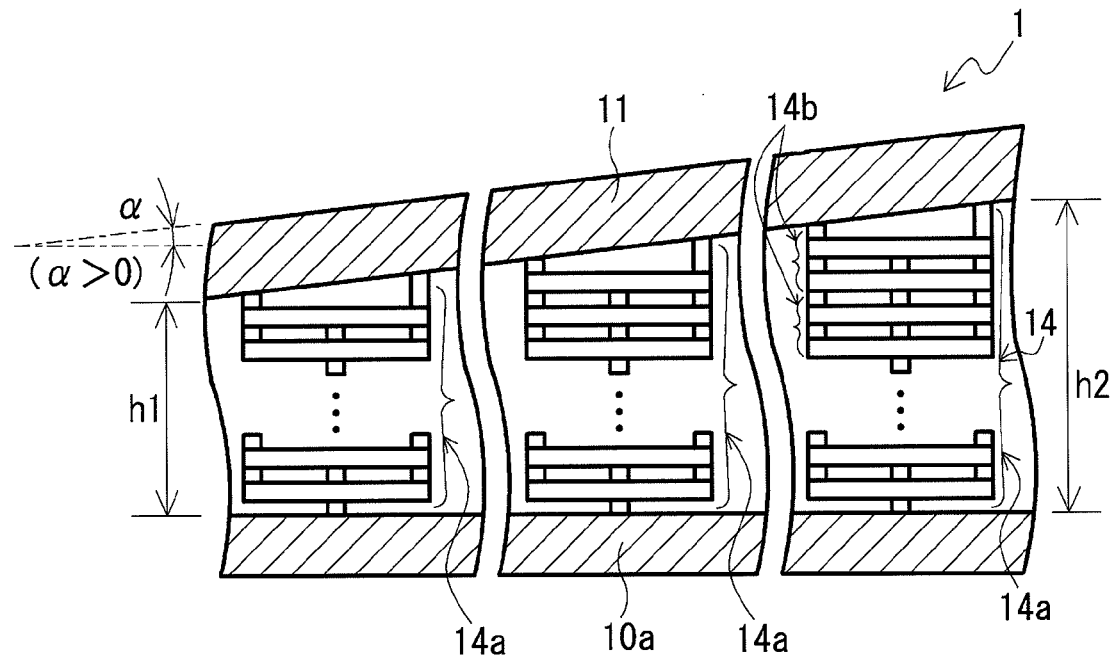
FIG. 4 is an enlarged view of the power generator and its surroundings in FIG. 2 when an operation panel is in non-rotating state.
Figure 5:
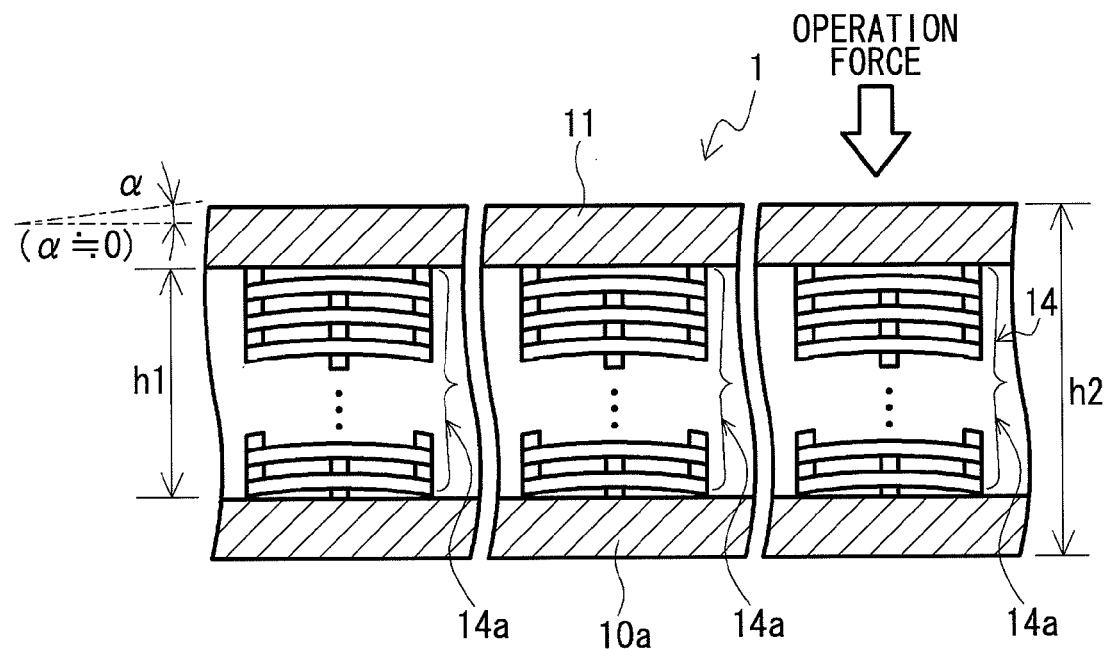
FIG. 5 is an enlarged view of the power generator and its surroundings in FIG. 2 when the operation panel is in rotating state.
Figure 6:
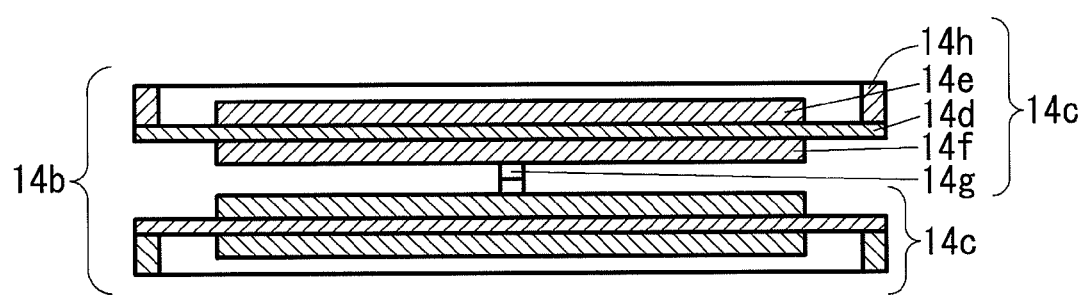
FIG. 6 is a longitudinal sectional view showing one pair-module in non-deformed state.
Figure 7:
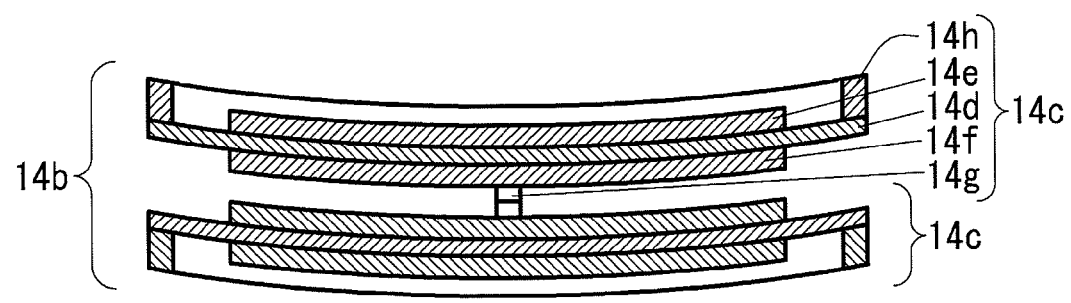
FIG. 7 is a longitudinal sectional view showing one pair-module in deformed state.
Figure 8:
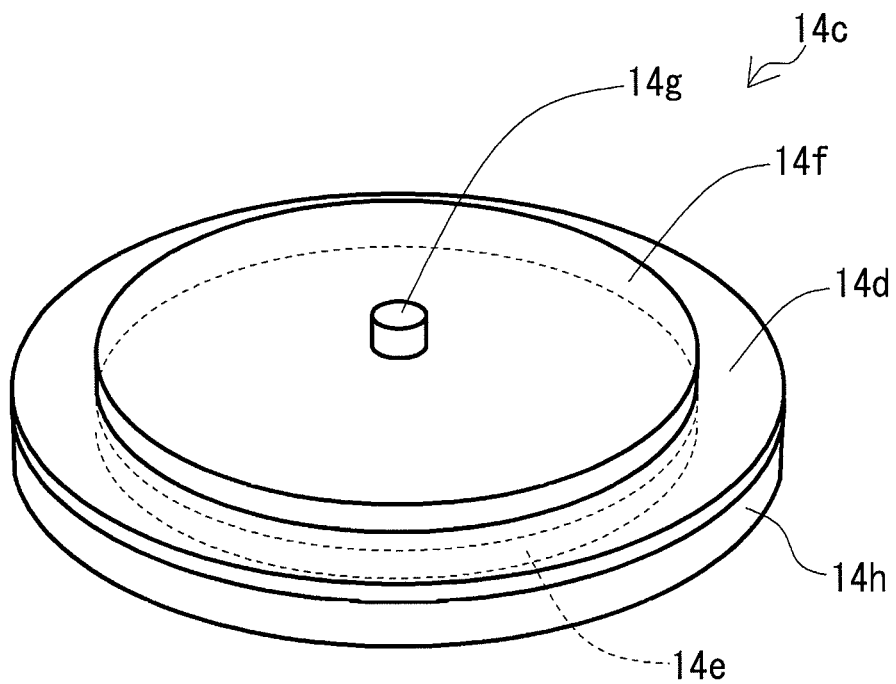
FIG. 8 is a perspective view of the lower piezoelectric module in FIG. 6 seen from above.
Figure 9:
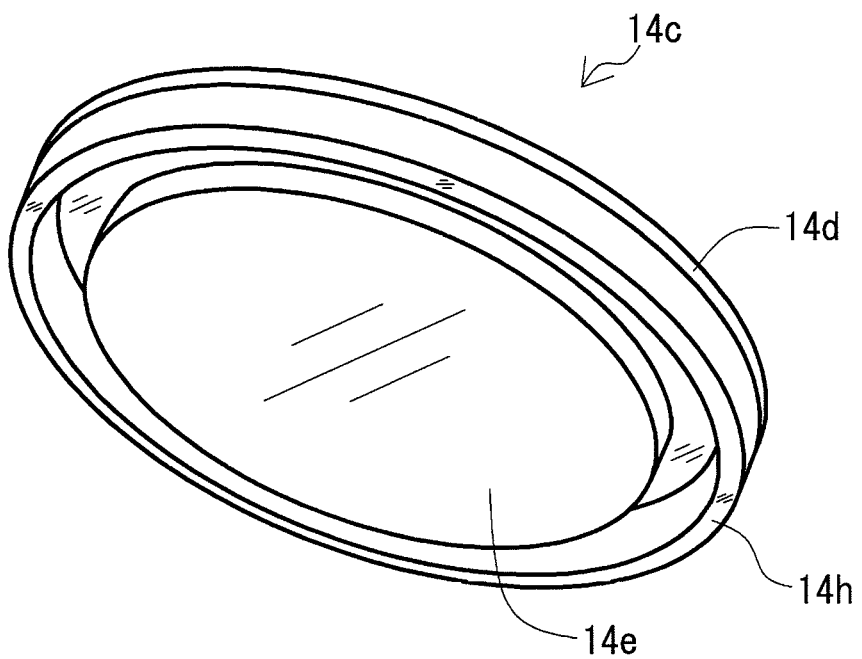
FIG. 9 is a perspective view of the lower piezoelectric module in FIG. 6 seen from below.

Next, a layer structure of the piezoelectric devices 14e, 14f in the power generator 14 is described. FIG. 4 is an enlarged view of the power generator 14 and its surroundings in FIG. 2 when the operation panel 11 is in non-rotating state. FIG. 5 is an enlarged view of the power generator 14 and its surroundings in FIG. 2 when the operation panel 11 is in rotating state (It should be noted that, in FIGS. 4 and 5 and FIGS. 11 and 12 to be referred to later, the operation panel 11 is shown with the angle and thickness calculated for effect for the purpose of illustration). FIG. 6 is a longitudinal sectional view showing one pair-module in non-deformed state. FIG. 7 is a longitudinal sectional view showing one pair-module in deformed state. FIG. 8 is a perspective view of the lower piezoelectric module in FIG. 6 seen from above. FIG. 8 is a perspective view of the lower piezoelectric module in FIG. 6 seen from below.

As shown in FIGS. 4 to 9, the power generator 14 includes a plurality of piezoelectric units 14a installed adjacent to each other in a direction perpendicular to the rotating shaft 11a of the operation panel 11 (in an adjacent installation direction shown in FIGS. 4 and 5). Also, the piezoelectric units 14a are installed adjacent to each other in a direction in parallel with the rotating shaft 11a of the operation panel 11 (in a direction perpendicular to the above-mentioned adjacent installation direction).

Each piezoelectric unit 14a is formed by layering a plurality of pair-modules 14b shown in FIGS. 6 and 7. Furthermore, each pair-module 14b is formed by layering a pair of piezoelectric modules 14c. As shown in FIGS. 6 to 9, each piezoelectric module 14c includes a diaphragm 14d, a pair of piezoelectric devices 14e, 14f, a central spacer 14g and a perimeter spacer 14h.

The diaphragm 14d is a support for stressing the piezoelectric devices 14e, 14f and also is a reinforcement for improving fracture strength of the piezoelectric devices 14e, 14f, which is formed of a metal plate having flexibility and durability. The diaphragm 14d may be formed of any appropriate material, and, for example, may be formed of stainless thin plate. The diaphragm 14d may have any appropriate planar shape, and, preferably, is uniformly deformed by an external force. In the first embodiment, the planar shape of the diaphragm 14d is a circular shape.

The pair of piezoelectric devices 14e, 14f generates electricity when deformed by pressure, formed of a piezoelectric ceramic, such as barium titanate or zirconia, or a piezoelectric monocrystalline, such as lithium tantalate ($LiTaO_3$), for example. The piezoelectric devices 14e, 14f are formed into a thin plate in the same shape as that of the diaphragm 14d and one size smaller than the diaphragm 14d. The piezoelectric devices 14e, 14f are secured to both side surfaces of the diaphragm 14d with an adhesive or the like. The piezoelectric devices 14e, 14f may have any appropriate planar shape, and, preferably, have a planar shape similar to that of the diaphragm 14d. In the first embodiment, the planar shape of the piezoelectric devices 14e, 14f is a circular shape with a diameter smaller than that of the diaphragm 14d. Also, the piezoelectric devices 14e, 14f may be placed at any appropriate position in planar direction with respect to the diaphragm 14d. Preferably, the piezoelectric devices 14e, 14f are placed in planar direction at the center of the diaphragm 14d because the amount of deformation will be largest at the center of the diaphragm 14d in planar direction. In the first embodiment, the piezoelectric devices 14e, 14f are placed at a position concentric with the diaphragm 14d. Although not shown, the piezoelectric devices 14e, 14f include a positive terminal on one surface and a negative terminal on the other surface. A positive lead connected to the positive terminal and a negative lead connected to the negative terminal are pulled out and connected to the rectifier 15a to provide power to the rectifier 15a.

The central spacer 14g is a transfer member for transferring deformation of piezoelectric devices 14e, 14f of one piezoelectric module 14c to piezoelectric devices 14e, 14f of the other piezoelectric module 14c adjacent to the one piezoelectric module 14c and also maintains a constant distance between the adjacent pairs of piezoelectric devices 14e, 14f. The central spacer 14g is secured to one of the pair of piezoelectric devices 14e, 14f secured to the diaphragm 14d (the piezoelectric device 14f in this embodiment) and placed near the center of the piezoelectric device 14f and secured to the piezoelectric device 14f with an adhesive or the like.

The perimeter spacer 14h maintains a constant distance between the adjacent piezoelectric modules 14c. The perimeter spacer 14h is secured to the perimeter of the diaphragm 14d surrounding the other of the pair of piezoelectric devices 14e, 14f secured to the diaphragm 14d (the piezoelectric device 14e in this embodiment) and is formed thick so as to project more outwardly than the piezoelectric device 14e. The perimeter spacer 14h may have any appropriate shape that surrounds the piezoelectric device 14e. For example, the perimeter spacer 14h may be a circular body placed concentric with the diaphragm 14d. However, the perimeter spacer 14h may have another shape. For example, the perimeter spacer 14h may be a plurality of columnar bodies placed along the perimeter surrounding the piezoelectric device 14e. For using the columnar bodies, in order to ensure the stability of the layer structure, the columnar bodies of the perimeter spacer 14h are preferably placed at three positions corresponding to the corners of an equilateral triangle with the centroid placed at the center of the diaphragm 14d in planar direction. Or the columnar bodies may be placed at three or more positions.

Each pair-module 14b is formed by layering the pair of piezoelectric modules 14c each formed as described above. Specifically, as shown in FIGS. 6 and 7, each pair-module 14b is formed by stacking the pair of piezoelectric modules 14c such that the central spacer 14g of the one piezoelectric module 14c and the central spacer 14g of the other piezoelectric module 14c adjacent to the one piezoelectric module 14c are in contact with each other on the same axis. In the pair-module 14b, the piezoelectric device 14e of the one piezoelectric module 14c is connected to the piezoelectric device 14f of the other piezoelectric module 14c with the central spacers 14g in between. So, as shown in FIG. 7, when the piezoelectric device 14e of the one piezoelectric module 14c is deformed, the piezoelectric device 14f of the other piezoelectric module 14c is pressed through the central spacers 14g to be deformed. In other words, applying an external force to the piezoelectric device 14e of the one piezoelectric module 14c enables the piezoelectric device 14f of the other piezoelectric module 14c to be applied with approximately the same amount of external force as that applied to the piezoelectric device 14e. Furthermore, the distance between the two piezoelectric devices 14e and 14f positioned inside one pair-module 14b is maintained constant by the central spacers 14g, which prevents the two piezoelectric devices 14e and 14f from being in contact with each other.

The piezoelectric unit 14a is formed by layering a plurality of the pair-modules 14b each formed as described above. Specifically, as shown in FIGS. 4 and 5, the pair-modules 14b are layered such that the perimeter spacer 14h of each pair-module 14b is in contact with another perimeter spacer 14h adjacent to the pair-module 14b. In this structure, when the piezoelectric devices 14e, 14f of each pair-module 14b are deformed, the diaphragm 14d to which the piezoelectric devices 14e, 14f are secured is also deformed, causing the perimeter spacer 14h secured to the diaphragm 14d to move in the vertical direction of the figure. This movement causes the perimeter spacer 14h of another pair-module 14b adjacent to the pair-module 14b to be pressed, which causes the diaphragm 14d to which the perimeter spacer 14h of the another pair-module 14b is secured, to be deformed, causing the piezoelectric devices 14e, 14f secured to this diaphragm 14d, to be deformed. Thus, deformation of one pair-module 14b can be transferred to another pair module 14b. Furthermore, the distance between the piezoelectric devices 14e, 14f positioned outside one pair-module 14b and the piezoelectric devices 14e, 14f positioned outside another pair-module 14b adjacent to the one pair-module 14b is maintained constant by perimeter spacers 14h, which prevents these two piezoelectric devices 14e, 14f from being in contact with each other. It should be noted that the central spacers 14g opposite to each other and the perimeter spacers 14h opposite to each other may be bonded to each other so as not to be misaligned.

Relation Between Rotatable Structure of Operation Panel and Layer Structure of Piezoelectric Devices Next, a relation between the rotatable structure of the operation panel 11 and the layer structure of the piezoelectric devices 14e, 14f is described. As shown in FIGS. 4 and 5, in non-rotating state, the operation panel 11 is placed at an angle of $\alpha$ ($>0$) with respect to the bottom surface 10a at which the operation panel 11 is not in approximately parallel with the bottom surface 10a, and in rotating state, the operation panel 11 is placed at an angle of $\alpha$ ($\approx 0$) at which the operation panel 11 is in approximately parallel with the bottom surface 10a. Accordingly, when the operation panel 11 is in non-rotating state, the operation panel 11 has a height with respect to the bottom surface 10a that gradually increases from a height h1 at a position near the rotating shaft 11a to a height h2 at a position far from the rotating shaft 11a (h1<h2), and, when the operation panel 11 is in rotating state, the height is approximately constant between those positions (h1≈h2).

In order to accommodate the difference in height (h2−h1) between in non-rotating state and in rotating state, in the first embodiment, the number of layers of the piezoelectric devices 14e, 14f of the plurality of piezoelectric units 14a (or the number of layers of the pair-modules 14b) is gradually increased from a position near the rotating shaft 11a of the operation panel 11 to a position far from the rotating shaft 11a. Specifically, the number of layers of the piezoelectric devices 14e, 14f of the piezoelectric units 14a is determined such that N1<Nn, where N1 is the number of layers of the piezoelectric devices 14e, 14f of a piezoelectric unit 14a placed at the nearest position from the rotating shaft 11a, and Nn is the number of layers of the piezoelectric devices 14e, 14f of a piezoelectric unit 14a placed at the farthest position from the rotating shaft 11a. The rate of increase from N1 to Nn may be set in any appropriate way. For example, each time the position of the piezoelectric unit 14a steps away from the rotating shaft 11a by one unit distance, the number of layers of the piezoelectric devices 14e, 14f may be incremented by one, or may be increased by a given constant number of layers, or may be intermittently or irregularly increased.

In this structure, when the user presses down any of the operation buttons 12 to put the operation panel 11 into rotating state, the piezoelectric devices 14e, 14f at a position near the rotating shaft 11a can be deformed by a large pressing force due to the principle of leverage, as shown in FIG. 5, to provide a large electromotive force. On the other hand, the piezoelectric devices 14e, 14f at a position far from the rotating shaft 11a can be deformed by a larger pressing force than that at the position near the rotating shaft 11a due to larger number of layers of the piezoelectric devices 14e, 14f of the piezoelectric unit 14a, to provide a large electromotive force. Furthermore, the piezoelectric devices 14e, 14f between the positions near and far from the rotating shaft 11a can be deformed by a large pressing force due to the principle of leverage and the larger number of layers of the piezoelectric devices 14e, 14f of the piezoelectric unit 14a, to provide a large electromotive force. Thus, a large electromotive force can be obtained across the power generator 14.

Control

Figure 10:
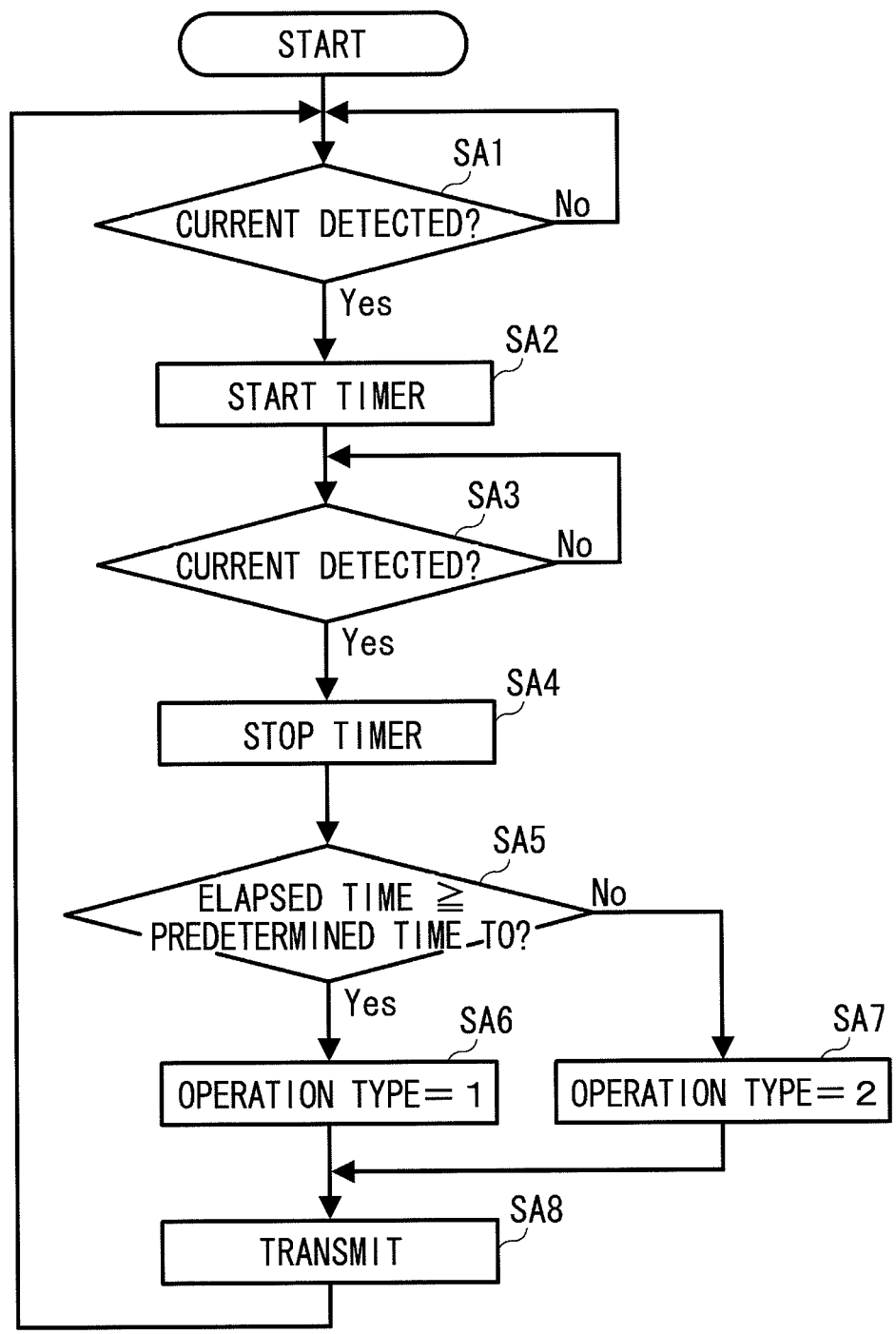
FIG. 10 is a control flowchart of a controller.

Finally, control by the controller 16 is described. FIG. 10 is a control flowchart of the controller 16. Hereinafter, "step" is abbreviated as "S." When the user presses down any of the operation buttons 12, the piezoelectric devices 14e, 14f are deformed to generate an electromotive force (hereinafter referred to as a first electromotive force), the first electromotive force being rectified by the rectifier 15a and charged into the recharger 15b. The operation identification unit 16c of the controller 16 monitors the output of the detector 16a (SA1). If current from the rectifier 15a to the recharger 15b is detected (or if the current exceeds a predetermined threshold) (SA1, Yes), the operation identification unit 16c determines that any of the pairs of the piezoelectric devices 14e, 14f are pressed and then determines that any of the operation buttons 12 is operated, then starts measuring time using the timer 16b (SA2).

Next, when the user releases the operation button 12 having been pressed down, the piezoelectric devices 14e, 14f are deformed to return to the initial state, again generating an electromotive force (hereinafter referred to as a second electromotive force), the second electromotive force being rectified by the rectifier 15a and charged into the recharger 15b. The operation identification unit 16c of the controller 16 monitors the output of the detector 16a (SA3). If current from the rectifier 15a to the recharger 15b is detected (or if the current exceeds a predetermined threshold) (SA3, Yes), the operation identification unit 16c determines that the pressure to any of the pairs of the piezoelectric devices 14e, 14f is released and then determines that any of the operation buttons 12 is operated, then stops measuring time using the timer 16b (SA2) and obtains the elapsed time from SA2 to that point in time (i.e., the time interval from when the first electromotive force was generated until when the second electromotive force was generated) (SA4).

Then, the operation identification unit 16c determines that a user operation type is 1 (SA6) if the elapsed time exceeds a predetermined time To (SA5, Yes) or determines that the user operation type is 2 (SA7) if the elapsed time is less than the predetermined time To (SA5, No). Then, based on this result of determination and the operation button 12 having been pressed down, detected by a known scheme when any of the operation buttons 12 was pressed down by the user at SA1, the operation identification unit 16c refers to the operation identification table stored in the memory 16d and identifies the operation having been performed by the user.

For example, according to the operation identification table, when a certain operation button 12 is operated, if the operation type is 1, the operation is identified to be "TV channel=1-ch" and if the operation type is 2, the operation is identified to be "TV channel=3-ch." Referring to this information, the operation identification unit 16c identifies the operation. Then, the operation identification unit 16c generates an operation signal for performing the identified operation, in a predefined format, and outputs the operation signal through the transmitter 16e (SA8). According to this control, two types of operations can be input even through an operation performed on one operation button 12 depending on the duration from when the operation button 12 is pressed down until when the operation button 12 is released, which enables two times the number of operations with respect to the number of the operation buttons 12.

It should be noted that the control by the controller 16 as described above and the outputting of the operation signal by the transmitter 16e can be performed using successively the power generated by the power generator 14 and charged in the recharger 15b, which eliminates the need for providing to the remote controller 1 a power supply (e.g., a battery) in addition to the power generator 14. However, if the electromotive force from the power generator 14 is not enough, a known power supply, such as a battery, may be used in combination.

Second Embodiment

Next, a second embodiment is described. In this embodiment, a plurality of piezoelectric units each include the power generation devices the number of layers of which is the same as each other, and, in each piezoelectric unit, the piezoelectric devices can be pressed down with a pressing plate placed inside a main body such that the pressing plate is in approximately parallel with another side surface of the main body opposite to the operation panel whether or not an operation force is applied to an operation means. It should be noted that the second embodiment has a configuration that is approximately the same as that of the first embodiment unless otherwise stated, and, for this configuration, the same reference numerals and/or component names as used for the first embodiment are appropriately used and the description is omitted.

Figure 11:
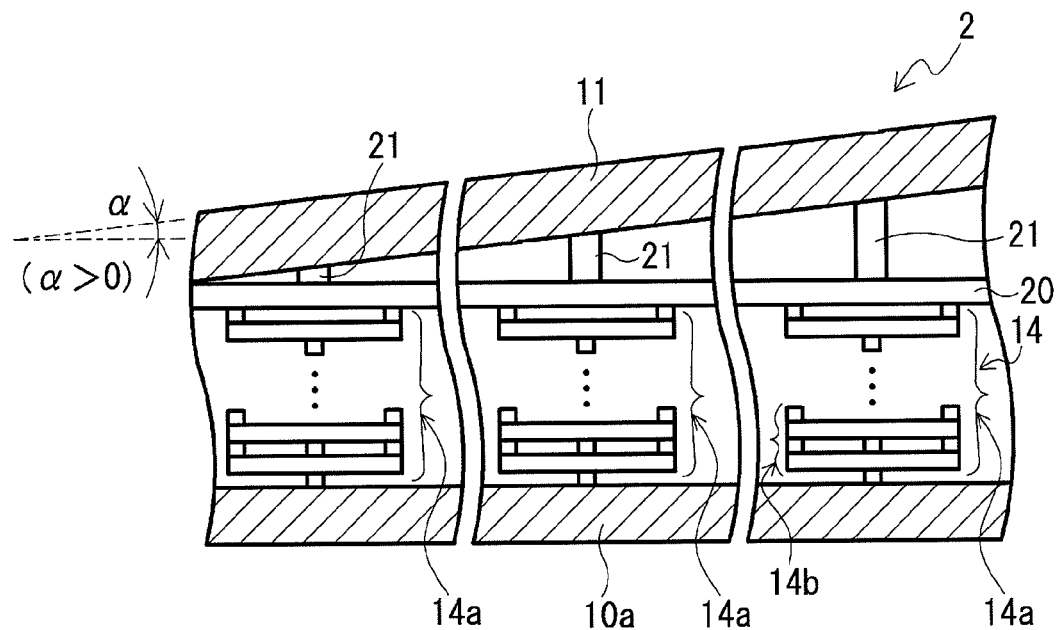
FIG. 11 is an enlarged view of a power generator and its surroundings in accordance with a second embodiment when an operation panel is in non-rotating state.
Figure 12:
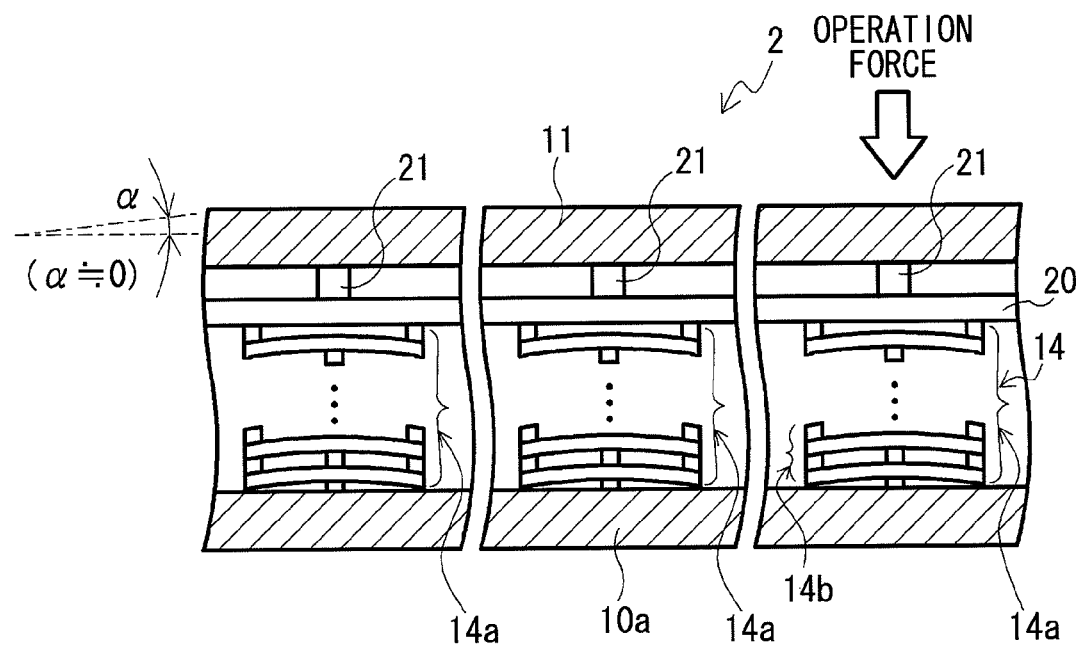
FIG. 12 is an enlarged view of the power generator and its surroundings when the operation panel is in rotating state.

FIG. 11 is an enlarged view of a power generator and its surroundings in accordance with the second embodiment when an operation panel 11 is in non-rotating state. FIG. 12 is an enlarged view of the power generator and its surroundings when the operation panel 11 is in rotating state. As shown FIGS. 11 and 12, a plurality of piezoelectric units 14a of a power generator 14 provided in a remote controller 2 in accordance with the second embodiment each include the same number of piezoelectric devices 14e, 14f (the same number of pair-modules 14b) that are layered. Accordingly, regardless of the distance from a rotating shaft 11a, the distance from a bottom surface 10a to the top of the piezoelectric units 14a is constant.

On the top of the piezoelectric units 14a thus configured, a pressing plate 20 is placed. The pressing plate 20 is a plate-like body having an area approximately corresponding to a plane on which the piezoelectric units 14a are adjacently installed, and is placed inside a main body 10 so as to be in approximately parallel with the bottom surface 10a. The pressing plate 20 is connected to the operation panel 11 by a plurality of connecting rods 21. The plurality of connecting rods 21 each have a length corresponding to the distance between the operation panel 11 and the pressing plate 20. In other words, the connecting rods 21 are formed so as to have a length that increases from a position near the rotating shaft 11a of the operation panel 11 to a position far from the rotating shaft 11a.

In this configuration, when a user presses down any of the operation buttons 12 provided on the operation panel 11 to put the operation panel 11 into rotating state, the pressing plate 20, pressed down by the connecting rods 21, presses the piezoelectric devices 14e, 14f of the plurality of piezoelectric units 14a by approximately the same force at the same time. Accordingly, a large pressing force due to the principle of leverage at a position near the rotating shaft 11a is distributed and applied to the piezoelectric units 14a by the pressing plate 20 to deform the piezoelectric devices 14e, 14f by a larger force, which can provide a large electromotive force.

Third Embodiment

Next, a third embodiment is described. In this embodiment, an operation panel includes a first operation panel and a second operation panel. The first operation panel can be rotated with respect to a main body about a first rotating shaft provided along at least one side of the sides of the first operation panel. The second operation panel can be rotated with respect to the main body about a second rotating shaft provided along at least one side of the sides of the second operation panel. The side along which the second rotating shaft of the second operation panel is provided is a side of the sides of the second operation panel that is in approximately parallel with the first rotating shaft and is the farthest from the first rotating shaft. It should be noted that the third embodiment has a configuration that is approximately the same as that of the first embodiment unless otherwise stated, and, for this configuration, the same reference numerals and/or component names as used for the first embodiment are appropriately used and the description is omitted.

Figure 13:
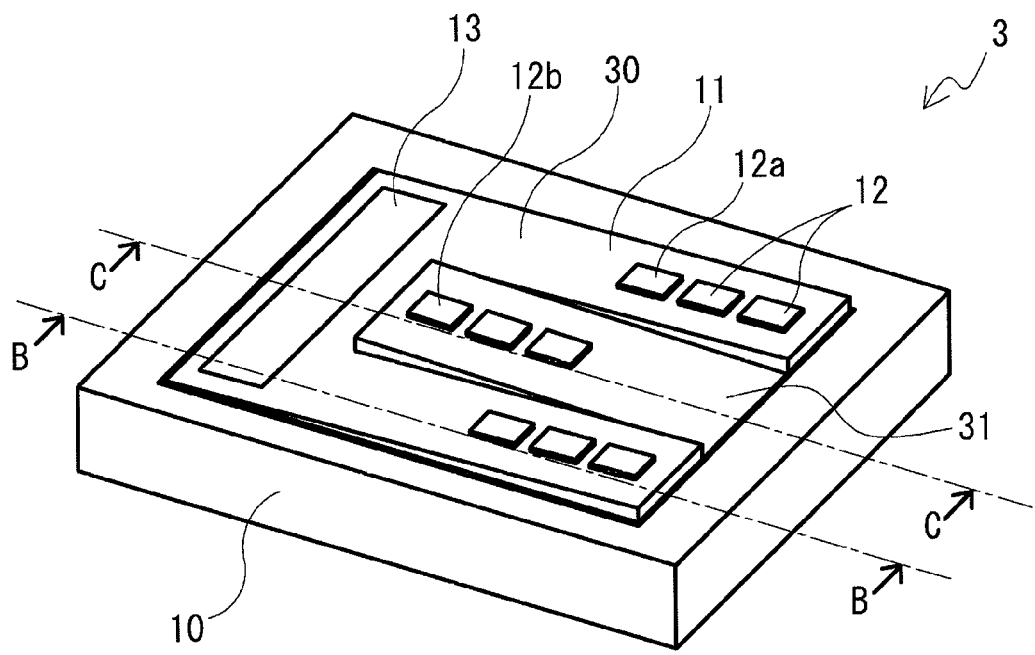
FIG. 13 is a general perspective view of a remote controller in accordance with a third embodiment.
Figure 14:
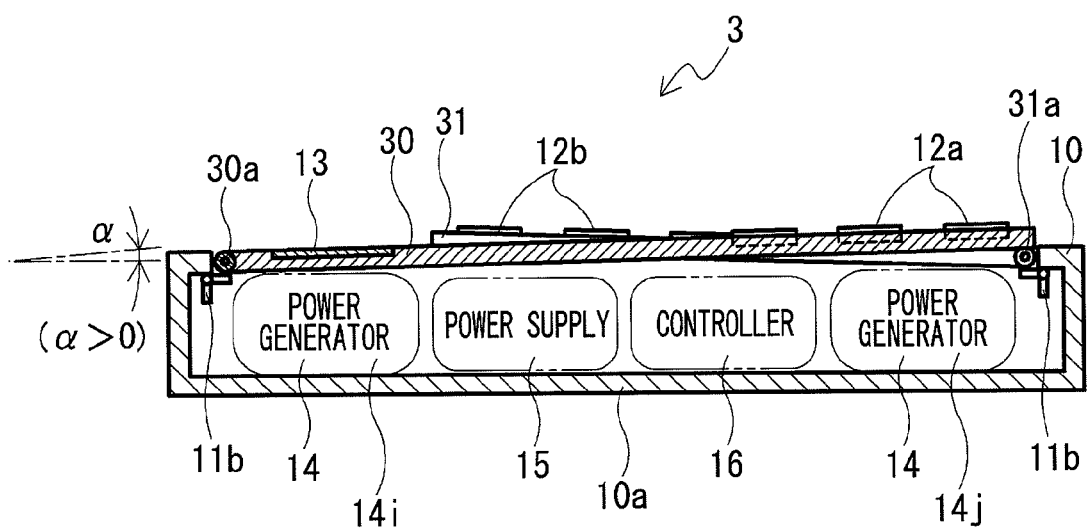
FIG. 14 is a cross-sectional view taken in the direction indicated by the arrows B-B in FIG. 13.
Figure 15:
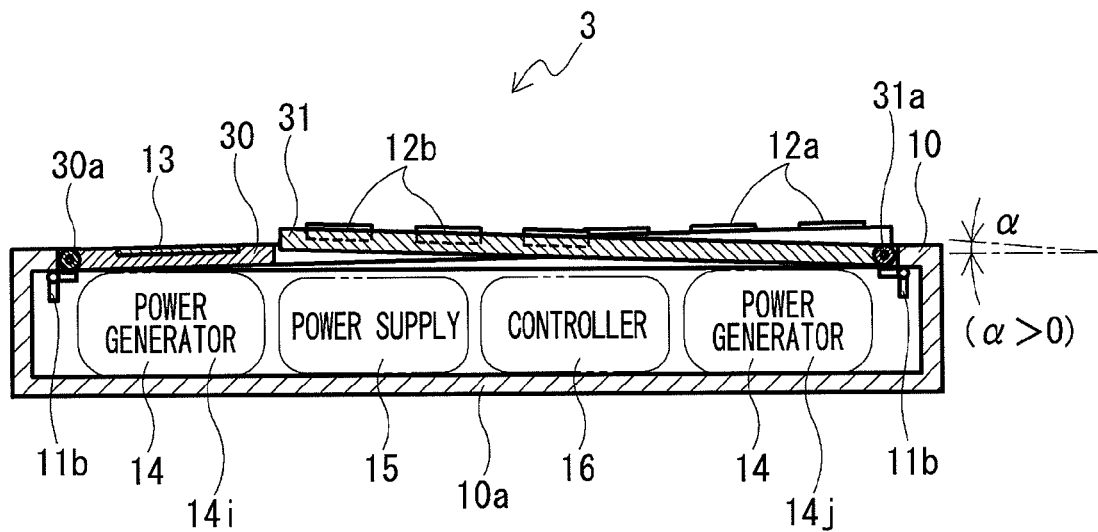
FIG. 15 is a cross-sectional view taken in the direction indicated by the arrows C-C in FIG. 13.

FIG. 13 is a general perspective view of a remote controller in accordance with the third embodiment. FIG. 14 is a cross-sectional view taken in the direction indicated by the arrows B-B in FIG. 13. FIG. 15 is a cross-sectional view taken in the direction indicated by the arrows C-C in FIG. 13. As shown in FIGS. 13 to 15, an operation panel 11 of a remote controller 3 in accordance with the third embodiment is divided into a first operation panel 30 and a second operation panel 31. The first operation panel 30 and the second operation panel 31 are formed of a metal or resin plate-like body as with the operation panel 11 in the first embodiment and include a plurality of plate-like operation buttons 12 in the form of a membrane switch, touch sensor, touch panel or the like and a display 13 in the form of a liquid crystal panel, implemented on their outer surfaces (however, the display 13 is provided only on the first operation panel 30). Hereinafter, the operation buttons 12 provided on the first operation panel 30 are referred to as first operation buttons 12a, and the operation buttons 12 provided on the second operation panel 31 are referred to as second operation buttons 12b.

The first operation panel 30 is formed to have an approximately U-like planar shape. The second operation panel 31 is formed to have an approximately I-like planar shape. The first operation panel 30 and the second operation panel 31 are fitted to each other at a position shown in FIG. 13 to form an operation panel surface approximately rectangular in planar direction.

As shown in FIG. 14, the first operation panel 30 can be rotated with respect to a main body 10 about a first rotating shaft 30a provided along at least one side (a side to the left of FIG. 14 in this embodiment) of the sides of the first operation panel 30. On the other hand, the second operation panel 31 can be rotated with respect to the main body 10 about a second rotating shaft 31a provided along at least one side (a side to the right of FIG. 15 in this embodiment) of the sides of the second operation panel 31. A rotatable structure provided by the first rotating shaft 30a and the second rotating shaft 31a is similar to the rotatable structure provided by the rotating shaft 11a in the first embodiment, so the description is omitted.

When no operation force is applied to any of the first operation buttons 12 (hereinafter referred to as "in non-operated state"), the first operation panel 30 is placed at an angle of $\alpha$ ($>0$) with respect to another side surface of the main body 10 opposite to the first operation panel 30 (hereinafter; a bottom surface 10a in the third embodiment) at which the first operation panel 30 is not in approximately parallel with the bottom surface 10a (hereinafter referred to as "in non-rotating state"). On the other hand, when an operation force is applied to any of the first operation buttons 12a (hereinafter referred to as "in operated state"), the first operation panel 30 is rotated to an angle of $\alpha$ ($\approx 0$) at which the first operation panel 30 is in approximately parallel with the bottom surface 10a (hereinafter referred to as "in rotating state"). Then, when the operation force having been applied to the first operation button 12a is released, a biasing force of a spring 11b presses up the first operation panel 30 so as to upwardly rotate the first operation panel 30 about the first rotating shaft 30a to the original position shown in FIGS. 13 to 15.

When no operation force is applied to any of the second operation buttons 12b (hereinafter referred to as "in non-operated state"), the second operation panel 31 is placed at an angle of $\alpha$ ($>0$) with respect to another side surface of the main body 10 opposite to the second operation panel 31 (hereinafter; the bottom surface 10a in the third embodiment) at which the second operation panel 31 is not in approximately parallel with the bottom surface 10a (hereinafter referred to as "in non-rotating state"). On the other hand, when an operation force is applied to any of the second operation buttons 12b (hereinafter referred to as "in operated state"), the second operation panel 30 is rotated to an angle of $\alpha$ ($\approx 0$) at which the second operation panel 31 is in approximately parallel with the bottom surface 10a (hereinafter referred to as "in rotating state"). Then, when the operation force having been applied to the second operation button 12b is released, a biasing force of a spring 11b presses up the second operation panel 31 so as to upwardly rotate the second operation panel 31 about the second rotating shaft 31a to the original position shown in FIGS. 13 to 15.

Furthermore, as shown in FIGS. 14 and 15, power generators 14 includes a first power generator 14i and a second power generator 14j. The first power generator 14i is placed at a position near the first rotating shaft 30a. The second power generator 14j is placed at a position near the second rotating shaft 31a. The first power generator 14i and the second power generator 14j each include a plurality of piezoelectric units 14a. Piezoelectric devices 14e, 14f of the piezoelectric units 14a generate an electromotive force that is provided to a common power supply 15, then a control similar to that in the first embodiment is performed.

The number of layers of the piezoelectric devices 14e, 14f of the plurality of piezoelectric units 14a provided in the first power generator 14i is gradually increased from a position near the first rotating shaft 30a to a position far from the first rotating shaft 30a. The number of layers of the piezoelectric devices 14e, 14f of the plurality of piezoelectric units 14a provided in the second power generator 14j is gradually increased from a position near the second rotating shaft 31a to a position far from the second rotating shaft 31a. Thus, the first power generator 14i and the second power generator 14j each can provide a larger electromotive force as with the first embodiment.

Fourth Embodiment

Next, a fourth embodiment is described. In this embodiment, a first extension plate is provided on a first operation panel at a position far from a first rotating shaft of the first operation panel, and a second extension plate is provided on a second operation panel at a position far from a second rotating shaft of the second operation panel. The first extension plate and the second extension plate have a shape such that the first extension plate and the second extension plate do not interfere with each other. It should be noted that the fourth embodiment has a configuration that is approximately the same as that of the third embodiment unless otherwise stated, and, for this configuration, the same reference numerals and/or component names as used for the third embodiment are appropriately used and the description is omitted.

Figure 16:
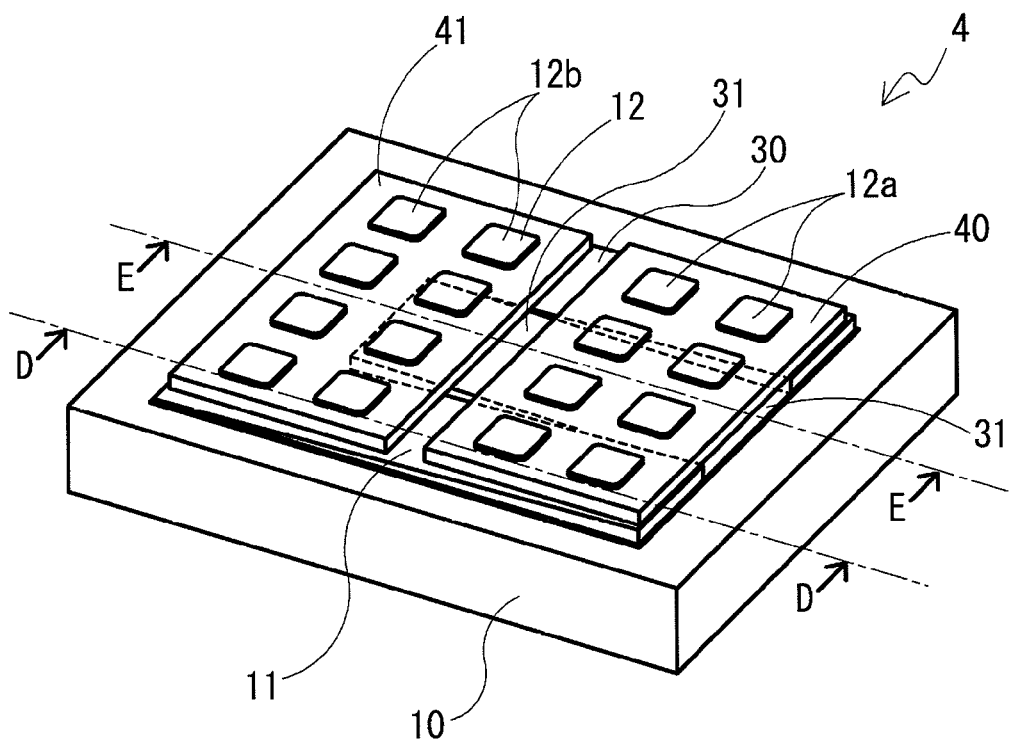
FIG. 16 is a general perspective view of a remote controller in accordance with a fourth embodiment.
Figure 17:
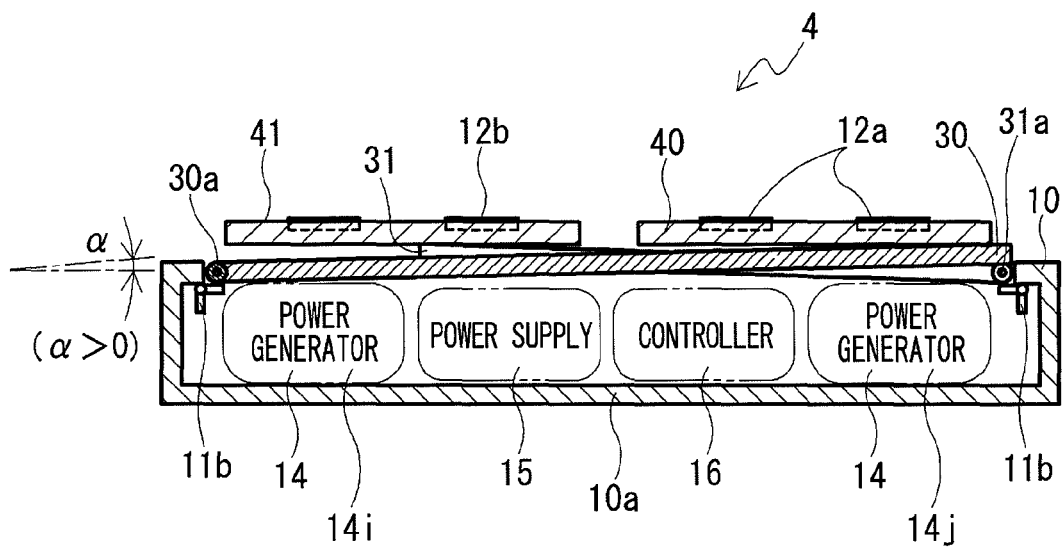
FIG. 17 is a cross-sectional view taken in the direction indicated by the arrows D-D in FIG. 16.
Figure 18:
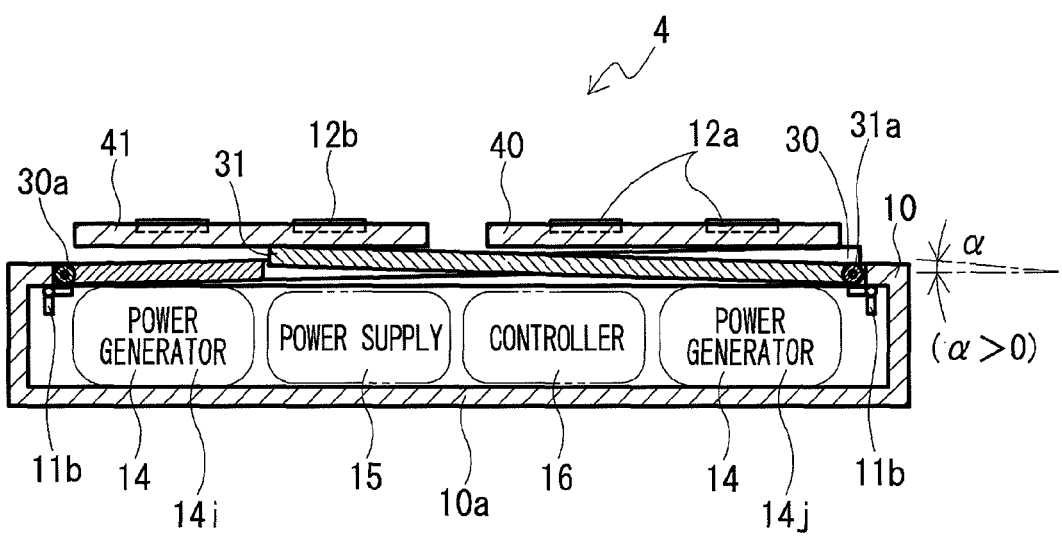
FIG. 18 is a cross-sectional view taken in the direction indicated by the arrows E-E in FIG. 16.

FIG. 16 is a general perspective view of a remote controller in accordance with the fourth embodiment. FIG. 17 is a cross-sectional view taken in the direction indicated by the arrows D-D in FIG. 16. FIG. 18 is a cross-sectional view taken in the direction indicated by the arrows E-E in FIG. 16. As shown in FIGS. 16 to 18, in a remote controller 4 in accordance with the fourth embodiment, a first extension plate 40 is provided on the outer surface of a first operation panel 30, and a second extension plate 41 is provided on the outer surface of a second operation panel 31.

In this embodiment, the first operation panel 30 and the second operation panel 31 are formed of a metal or resin plate-like body, and the first extension plate 40 and the second extension plate 41 are formed of a metal or resin plate-like body as with the operation panel 11 in the first embodiment and include a plurality of plate-like operation buttons 12 in the form of a membrane switch, touch sensor, touch panel or the like, implemented on their outer surfaces (however, the display 13 is omitted). Hereinafter, the operation buttons 12 provided on the first extension plate 40 are referred to as first operation buttons 12a, and the operation buttons 12 provided on the second extension plate 41 are referred to as second operation buttons 12b.

The first extension plate 40 is provided on the first operation panel 30 at a position far from a first rotating shaft 30a. So, pressing down any of the first operation buttons 12a enables pressing down of the first operation panel 30 at a position far from the first rotating shaft 30a, providing an effect of the principle of leverage. Also, the second extension plate 41 is provided on the second operation panel 31 at a position far from a second rotating shaft 31a. So, pressing down any of the second operation buttons 12b enables pressing down of the second operation panel 31 at a position far from the second rotating shaft 31a, providing an effect of the principle of leverage.

Particularly, pressing down the first extension plate 40 at any position enables pressing down of the first operation panel 30 at a position far from the first rotating shaft 30a, so the first operation buttons 12a may be placed at any position on the outer surface of the first extension plate 40. Also, pressing down the second extension plate 41 at any position enables pressing down of the second operation panel 31 at a position far from the second rotating shaft 31a, so the second operation buttons 12b may be placed at any position on the outer surface of the second extension plate 41. Thus, an area in which the first operation buttons 12a and the second operation buttons 12b may be placed becomes wider, which enables effective utilization of the operation panel surface and increase in freedom of placing the first operation buttons 12a and the second operation buttons 12b.

It should be noted that, since the first extension plate 40 and the second extension plate 41 are placed at approximately the same position in height direction, they should be placed so as not to interfere with each other. Accordingly, in the fourth embodiment, the first extension plate 40 has a planar shape that is a rectangular shape having an area approximately equal to the area of one-half far from the first rotating shaft 30a of the operation panel surface formed of the first operation panel 30 and the second operation panel 31, and the second extension plate 41 has a planar shape that is a rectangular shape having an area approximately equal to the area of one-half far from the second rotating shaft 31a of the operation panel surface formed of the first operation panel 30 and the second operation panel 31. Thus, the combined area of the first extension plate 40 and the second extension plate 41 is approximately the same as that of the operation panel surface formed of the first operation panel 30 and the second operation panel 31, enabling effective utilization of the operation panel surface.

It is also required that, when the first operation panel 30 is rotated by the first extension plate 40, the first extension plate 40 does not interfere with the main body 10 and the second operation panel 31; and, when the second operation panel 31 is rotated by the second extension plate 41, the second extension plate 41 does not interfere with the main body 10 and the first operation panel 30. Accordingly, in the fourth embodiment, the position of the first operation panel 30 after the rotation is set to a position such that the first extension plate 40 does not interfere with the main body 10 and the second operation panel 31 rather than a position such that the first operation panel 30 is in approximately parallel with the bottom surface 10a. Also, the position of the second operation panel 31 after the rotation is set to a position such that the second extension plate 41 does not interfere with the main body 10 and the first operation panel 30 rather than a position such that the second operation panel 31 is in approximately parallel with the bottom surface 10a. Such a position can be adjusted by adjusting the number of layers of piezoelectric devices 14e, 14f of piezoelectric unit 14a (or the number of layers of pair-modules 14b). Or the above-described interference may be avoided by connecting the first extension plate 40 to the first operation panel 30 with a space in between or connecting the second extension plate 41 to the second operation panel 31 with a space in between to place the first extension plate 40 or the second extension plate 41 to a position more outside than the shown position.

According to the above mentioned embodiments, in comparison with a conventional structure in which a power generation device is deformed only by a force when an input key is pressed, generating an electromotive force by deforming a power generation device with a force from an operation panel rotated by an operation force enables the power generation device to be deformed by a larger force even with the same operation force, by utilizing rotation moment, enabling increase in the electromotive force to improve power generation efficiency.

Furthermore, according to the above mentioned embodiments, allowing the operation panel to be rotated about a rotating shaft provided along a side of the sides of the operation panel enables a rotational pivot point of the operation panel to be positioned at an end of the operation panel to lengthen the distance from a point of force application when the operation means is operated to the rotational pivot point, enabling increase in rotation moment.

Furthermore, according to the above mentioned embodiments, rotating the operation panel from when in non-operated state until when in operated state so that the operation panel is in approximately parallel with another side surface opposite to the operation panel when the operation ends allows a user to easily recognize when the operation ends, enabling improvement in operational feeling of the user.

Furthermore, according to the above mentioned embodiments, using a first operation panel and a second operation panel as the operation panel and providing a first rotating shaft of the first operation panel and a second rotating shaft of the second operation panel at positions far from each other allows a point of force application for the first operation panel to obtain a large rotation moment and a point of force application for the second operation panel to obtain a large rotation moment to be placed at positions different from each other, allowing the operation means to be placed at these different positions. This enables wide area utilization of the operation panel surface, placement of many operation means and increase in freedom of placing operation means.

Furthermore, according to the above mentioned embodiments, rotating the first and second operation panels from when in non-operated state until when in operated state so that the first and second operation panels are in approximately parallel with another side surface opposite to the first and second operation panels when the operation ends allows a user to easily recognize when the operation ends, enabling improvement in operational feeling of the user.

Furthermore, according to the above mentioned embodiments, shaping the first extension plate of the first operation panel and the second extension plate of the second operation panel such that the first extension plate and the second extension plate do not interfere with each other allows the first operation panel or the second operation panel to be rotated by being pressed down when an operation means provided on the first extension plate is pressed down or when an operation means provided on the second extension plate is pressed down. This further increases the area in which an operation means can be placed, enabling further effective utilization of the operation panel surface and further increase in freedom of placing an operation means.

Furthermore, according to the above mentioned embodiments, increasing the number of layers of the power generation devices gradually from a position near the rotating shaft of the operation panel to a position far from the rotating shaft allows the power generation devices at a position near the rotating shaft to be deformed by a large pressing force due to the principle of leverage, providing a large electromotive force. This also allows the power generation devices at a position far from the rotating shaft to be deformed by a larger pressing force than that at the position near the rotating shaft because of larger number of layers of the power generation devices, providing a large electromotive force. This also allows the power generation devices between the positions near and far from the rotating shaft to be deformed by a large pressing force due to the principle of leverage and the larger number of layers of the power generation devices, providing a large electromotive force. Thus, a large electromotive force can be obtained across the power generator.

Furthermore, according to the above mentioned embodiments, providing a constant number of layers of the power generation devices at any position and allowing the power generation devices to be pressed by a pressing plate placed inside the main body allows the pressing plate to be pressed down when the operation panel is in rotating state to press the power generation devices at any position by an approximately uniform force at the same time, enabling the power generation devices to be deformed by a larger force to generate a large electromotive force.

Furthermore, according to the above mentioned embodiments, placing the power generator at a position near the rotating shaft allows the power generation devices to be deformed by a large pressing force due to the principle of leverage, to generate a large electromotive force.

Furthermore, according to the above mentioned embodiments, placing the operation means at a position near a side of the sides of the operation panel opposite to the rotating shaft allows the operation panel to be pressed down at a position far from the pivot point at which the rotating shaft of the operation panel is positioned, enabling the power generation devices to be deformed by a large pressing force due to the principle of leverage, to generate a large electromotive force.

Furthermore, according to the above mentioned embodiments, identifying an operation performed on the operation means based on the time interval from when the first electromotive force was generated until when the second electromotive force was generated allows two types of operations to be input even through an operation performed on one operation means depending on the duration from when the operation means is pressed down until when the operation means is released, enabling two times the number of operations with respect to the number of the operation means.

Furthermore, according to the above mentioned embodiments, since the power generation device is a piezoelectric device, the power generator can be manufactured relatively simply and inexpensively.

Furthermore, according to the above mentioned embodiments, since the electric apparatus is a remote controller including a signal output means for providing an operation signal, the power generator can supply at least part of power to be supplied to the remote controller to reduce the dependence on or eliminate the need for a battery power supply, enabling configuration of an environmentally-friendly remote controller.

Furthermore, according to the above mentioned embodiments, since the electric apparatus is an electric apparatus to be built in a building including a lighting means for lighting a floor or staircase, the power generator can supply at least part of power to be supplied to the electric apparatus to be built in a building to reduce the dependence on or eliminate the need for a battery power supply, enabling configuration of a environmentally-friendly electric apparatus to be built in a building.

III. Variation of the Embodiments

While various embodiments of the invention have been described above, any modification and improvement may be made to the specific configuration and means of the invention without departing from the scope of the technical spirit of the invention described in the claims. Such a variation is described below.

Problems to be Solved and Advantageous Effect of the Invention

First, a problem to be solved by the invention and an advantageous effect of the invention are not limited to those described above. The invention may also solve a problem not described above or achieve an advantageous effect not described above. Or the invention may also solve only a part of a problem described above or achieve only a part of an advantageous effect described above.

Basic Configuration and Purpose of the Electric Apparatus

As described above, the basic configuration and purpose of the electric apparatus is without any limitation unless otherwise stated. For example, in addition to the remote controller, the electric apparatus may be configured as a mobile phone, an electric apparatus to be built in a building including a lighting means for lighting a floor or staircase, a lighting means to be built in a shoe or bicycle pedal for lighting around the shoe or bicycle, a communication means to be built in a shoe or bicycle pedal for performing communication between a shoe or bicycle and an external apparatus, and the like. The electric apparatus to be built in a building may be configured by, for example, installing an electric apparatus in accordance with the invention into the interior of a floor or staircase and exposing an operation panel to the outside as a floor panel or stair tread so that, when a user walks on the floor or staircase, the operation panel is pressed to generate an electromotive force that can activate a light placed around the floor or staircase. Or the electric apparatus to be built in a shoe or bicycle may be configured by, for example, installing an electric apparatus in accordance with the invention into the interior of a shoe or bicycle pedal and exposing an operation panel to the outside as a sole of the shoe or a tread of the bicycle pedal so that, when a user presses the shoe or the pedal, the operation panel is pressed to generate an electromotive force. Even when the electric apparatus is configured as a remote controller, power generated by the power generator may be used for a purpose other than control and transmission. For example, the electric apparatus may be configured to be a remote controller that emits light by activating a lighting means, such as an LED, provided to be exposed to the outside of the main body when a user grips the remote controller.

Placement Angle and Rotation Angle of the Operation Panel

The placement angle and rotation angle of the operation panel may be an angle other than the angle used in the above embodiment. For example, the operation panel may be in approximately parallel with the bottom surface in non-rotating state and not in parallel with the bottom surface in rotating state. Or the operation panel may be not in parallel with the bottom surface in both non-rotating state and rotating state, and the angle of the operation panel with respect to the bottom surface may be different between non-rotating state and rotating state.

Description of Reference Numerals and Signs 1, 2, 3, 4 remote controller
10 main body
10a bottom surface
11 operation panel
11a rotating shaft
11b spring
12 operation buttons
12a first operation buttons
12b second operation buttons
13 display
14 power generator
14a piezoelectric units
14b pair-modules
14c piezoelectric modules
14d diaphragm
14e, 14f piezoelectric devices
14g central spacer
14h perimeter spacer
14i first power generator
14j second power generator
15 power supply
15a rectifier
15b recharger
16 controller
16a detector
16b timer
16c operation identification unit
16d memory
16e transmitter
20 pressing plate
21 connecting rods
30 first operation panel
30a first rotating shaft
31 second operation panel
31a second rotating shaft
40 first extension plate
41 second extension plate

What is claimed is:

1. An electric apparatus provided with power generating function, comprising:
   a power generator;
   a main body;
   an operation panel provided on one side surface of the main body; and
   an operation means provided on the operation panel, to be exposed to the outside of the electric apparatus;
   wherein the power generator has a power generation device that generates an electromotive force when deformed,
   wherein the operation panel can be rotated with respect to the main body by an operation force applied to the operation means, and
   wherein the power generation device of the power generator generates an electromotive force when deformed by a force from the operation panel rotated by the operation force.

2. The electric apparatus provided with power generating function according to claim 1,
   wherein the operation panel can be rotated with respect to the main body about a rotating shaft provided along at least one side of the sides of the operation panel.

3. The electric apparatus provided with power generating function according to claim 2,
   wherein the operation panel includes a first operation panel and a second operation panel,
   wherein the first operation panel can be rotated with respect to the main body about a first rotating shaft provided along at least one side of the sides of the first operation panel,
   wherein the second operation panel can be rotated with respect to the main body about a second rotating shaft provided along at least one side of the sides of the second operation panel, and
   wherein the side along which the second rotating shaft of the second operation panel is provided is a side of the sides of the second operation panel that is in approximately parallel with the first rotating shaft and is the farthest from the first rotating shaft.

4. The electric apparatus provided with power generating function according to claim 3,
   wherein, when the operation force is not applied to the operation means, the first operation panel is placed at an angle with respect to another side surface of the main body opposite to the first operation panel at which the first operation panel is not in approximately parallel with the another side surface,
   wherein, when the operation force is applied to the operation means, the first operation panel is placed at an angle with respect to the another side surface of the main body opposite to the first operation panel at which the first operation panel is in approximately parallel with the another side surface, wherein, when the operation force is not applied to the operation means, the second operation panel is placed at an angle with respect to another side surface of the main body opposite to the second operation panel at which the second operation panel is not in approximately parallel with the another side surface and also is not in approximately parallel with the first operation panel when the operation force is not applied to the operation means, and wherein, when the operation force is applied to the operation means, the second operation panel is placed at an angle with respect to the another side surface of the main body opposite to the second operation panel at which the second operation panel is in approximately parallel with the another side surface.

5. The electric apparatus provided with power generating function according to claim 3, wherein a first extension plate is provided on the first operation panel at a position far from the first rotating shaft of the first operation panel, wherein a second extension plate is provided on the second operation panel at a position far from the second rotating shaft of the second operation panel, and wherein the first extension plate and the second extension plate have a shape such that the first extension plate and the second extension plate do not interfere with each other.

6. The electric apparatus provided with power generating function according to claim 2, wherein the power generator is placed at a position near the rotating shaft.

7. The electric apparatus provided with power generating function according to claim 2, wherein the operation means is placed at a position near a side of the sides of the operation panel opposite to the rotating shaft.

8. The electric apparatus provided with power generating function according to claim 2, wherein, when the operation force is not applied to the operation means, the operation panel is placed at an angle with respect to another side surface of the main body opposite to the operation panel at which the operation panel is not in approximately parallel with the another side surface, and wherein, when the operation force is applied to the operation means, the operation panel is placed at an angle with respect to the another side surface of the main body opposite to the operation panel at which the operation panel is in approximately parallel with the another side surface.

9. The electric apparatus provided with power generating function according to claim 8, wherein a plurality of power generation device modules each formed by layering a plurality of the power generation devices are installed adjacent to each other in a direction perpendicular to the rotating shaft of the operation panel, and wherein the plurality of power generation device modules each include the power generation devices the number of layers of which increases gradually from a position near the rotating shaft of the operation panel to a position far from the rotating shaft.

10. The electric apparatus provided with power generating function according to claim 8, wherein a plurality of power generation device modules each formed by layering a plurality of the power generation devices are installed adjacent to each other in a direction perpendicular to the rotating shaft of the operation panel, wherein the plurality of power generation device modules each include the power generation devices the number of layers of which is the same as each other, and wherein the power generation devices can be pressed down with a pressing plate placed inside the main body such that the pressing plate is in approximately parallel with the another side surface of the main body opposite to the operation panel whether or not the operation force is applied to the operation means.

11. The electric apparatus provided with power generating function according to claim 1, comprising an operation identification means for identifying what operation has been performed on the operation means, wherein the power generation device of the power generator generates a first electromotive force when deformed by a force from the operation panel rotated by the operation force, wherein the power generation device of the power generator generates a second electromotive force when deformed by releasing the operation force to release the force from the operation panel, and wherein the operation identification means identifies what operation has been performed on the operation means, based on a time interval from when the first electromotive force was generated until when the second electromotive force was generated.

12. The electric apparatus provided with power generating function according to claim 1, wherein the power generation device is a piezoelectric device.

13. The electric apparatus provided with power generating function according to claim 1, wherein the electric apparatus is a remote controller comprising a signal output means for providing an operation signal.

14. The electric apparatus provided with power generating function according to claim 1, wherein the electric apparatus is an electric apparatus to be built in a building comprising a lighting means for lighting a floor or staircase.

* * * * *